(12) United States Patent
Adenau

(10) Patent No.: US 10,149,372 B2
(45) Date of Patent: Dec. 4, 2018

(54) LIGHTING CONTROL CONSOLE HAVING A TACTILE SENSOR SYSTEM

(71) Applicant: MA Lighting Technology GmbH, Waldbüttelbrunn (DE)

(72) Inventor: Michael Adenau, Würzburg (DE)

(73) Assignee: MA LIGHTING TECHNOLOGY GMBH, Waldbüttelbrunn (DE)

( * ) Notice: Subject to any disclaimer, the term of this patent is extended or adjusted under 35 U.S.C. 154(b) by 0 days.

(21) Appl. No.: 15/869,969

(22) Filed: Jan. 12, 2018

(65) Prior Publication Data
US 2018/0206309 A1 Jul. 19, 2018

(30) Foreign Application Priority Data

Jan. 18, 2017 (DE) .................... 20 2017 100 248 U

(51) Int. Cl.
*H05B 37/02* (2006.01)
*H01H 15/10* (2006.01)
(Continued)

(52) U.S. Cl.
CPC ........... *H05B 37/029* (2013.01); *G05G 1/025* (2013.01); *G06F 3/044* (2013.01); *H01H 15/04* (2013.01); *H01H 15/10* (2013.01); *H01H 15/16* (2013.01); *H03K 17/962* (2013.01); *H05B 37/0245* (2013.01); *F16H 19/06* (2013.01);
(Continued)

(58) Field of Classification Search
CPC ............................ H05B 33/08; H05B 33/0809; H05B 33/0815; H05B 33/0848; H05B 33/0884; H05B 33/0896; H05B 33/0863; H05B 37/02; H05B 37/029; H05B 37/0254; H01H 15/04; H01H 15/10; G05G 1/025; G05G 2700/02; G05G 2700/16; F16H 19/06; F16H 2019/0686
USPC ....... 315/151–153, 291, 297, 308, 312, 316, 315/320
See application file for complete search history.

(56) References Cited

U.S. PATENT DOCUMENTS 4,173,941 A * 11/1979 Castagna ............. H05K 5/0017
116/278
9,402,291 B1   7/2016 Adenau
(Continued)

FOREIGN PATENT DOCUMENTS

DE     102006044478 A1    3/2007
DE     202016105915 U1    11/2016
EP        1784058 A2      5/2007

OTHER PUBLICATIONS

European Patent Office, Search Report, Application No. 17203556, Apr. 24, 2018, 2 pages.

*Primary Examiner* — Jimmy Vu
(74) *Attorney, Agent, or Firm* — Quarles & Brady LLP

(57) ABSTRACT

A lighting control console for controlling a lighting system includes digital adjusting commands being generated in the lighting control console that are transmitted to the lighting system via data links. The lighting control console includes at least one slide control for inputting operating commands via linear displacement of a control knob protruding from the upper side of the console housing. The upper side of the console housing includes a slit for each slide control. The control knob is connected to the slide control via the slit. A tactile sensor system provided at the slide control can detect when the user touches the control knob.

11 Claims, 4 Drawing Sheets

(51) Int. Cl.
*H03K 17/96* (2006.01)
*H01H 15/16* (2006.01)
*G05G 1/02* (2006.01)
*H01H 15/04* (2006.01)
*G06F 3/044* (2006.01)
*F16H 19/06* (2006.01)

(52) U.S. Cl.
CPC . *F16H 2019/0686* (2013.01); *G05G 2700/02* (2013.01); *G05G 2700/16* (2013.01)

(56) References Cited

U.S. PATENT DOCUMENTS

| | | |
|---|---|---|
| 9,760,172 B2 * | 9/2017 | Ray .................... G06F 3/04886 |
| 2007/0068786 A1 | 3/2007 | Hein |
| 2013/0314369 A1 | 11/2013 | Liu |
| 2018/0113608 A1 | 4/2018 | Adenau et al. |

\* cited by examiner

LIGHTING CONTROL CONSOLE HAVING A TACTILE SENSOR SYSTEM

CROSS-REFERENCE TO RELATED APPLICATIONS

This application claims priority to German Utility Model Application No. 20 2017 100 248.9 filed on Jan. 18, 2017. The contents of the priority application are hereby incorporated by reference as if set forth in their entirety herein.

BACKGROUND

Generic lighting control consoles serve for controlling lighting systems, as they are used for concert stages or in theaters, for example. These lighting systems regularly comprise a plurality of lighting devices, such as stage lights, said lighting devices in their own right often being able to be switched between a plurality of lighting conditions, such as different colors. These different lighting conditions of the lighting devices connected to the respective lighting control console can be controlled via preprogrammed parameters in the lighting program of the lighting control console. For this purpose, common lighting systems can comprise up to several thousand lighting devices. In order to be able to control such complex lighting systems, the generic lighting control consoles are equipped with a digital processor which enables digital data and signal processing. In order to store the control data, a digital memory is commonly provided which enables in particular storing or archiving lighting programs. For protecting the electric and electronic components of the lighting control console, the corresponding components are installed in a console housing which shields the electric and electronic components of the lighting control console towards the exterior.

For programming the lighting program or rather for controlling the lighting program during operation, the user has to input operating commands as input values. These operating commands can be a selection of a specific lighting device or the setting of a specific parameter, for example. In order to be able to input these operating commands, mechanical operating elements, such as buttons, rotary controls (encoders) or slide controls, are provided in known lighting control consoles, said operating elements being arranged in an operating panel on the upper side of the console housing. The operating commands allocated to the individual operating elements can be altered by adequately switching the menu in order to be able to program and control correspondingly complex lighting programs.

The slide controls, in particular, are immensely important when programming the lighting programs. The slide controls comprise a control knob which protrudes from the console housing on the upper side of the lighting control console and which can be linearly displaced by the user for setting certain programming parameters. A slit is provided in the console housing itself for each slide control, the control knob on the outer side of the console housing being connected to the slide control, which is installed in the housing itself, via said slit.

SUMMARY

Due to the plurality of operating elements in known console housings, the programming of lighting programs requires a lot of experience and a high level of concentration. The object of the invention at hand is therefore to propose a new lighting control console which supports the user while programming and while using the lighting control console via suitable assistance measures.

This object is attained by a lighting control console according to the teachings of claim 1.

Advantageous embodiments of the invention are the subject matter of the dependent claims.

The lighting control console according to the invention is based upon the fundamental idea that a tactile sensor system, by means of which it can be detected when the user touches the control knob, is provided at the slide control. It thus becomes possible for certain assistance measures, such as fading in certain menus, to be automatically triggered by the control as soon as the user touches the control knob.

In which manner the tactile sensor system is constructively realized is generally arbitrary. The tactile sensor system can be realized particularly simply if the control knob is made of an electrically conductive material. As soon as the user touches the control knob, the changes in the electronic properties triggered by the control knob being touched can be easily detected via suitable electronic evaluation devices.

The tactile sensor system can be particularly easily realized if the capacitive change caused by the user touching the control knob can be detected.

In order to be able to provide the familiar tactile feel of the control knob of the slide control to the user and to be able to simultaneously electrically evaluate the touching of the control knob by the user, it is particularly advantageous if the control knob is made of an electrically conductive plastic.

With regard to preventing disruptions of the lighting control console, it is of great significance to prevent impurities and dust from penetrating the housing of the slide control as much as possible. In particular for slide controls containing a sliding contact, dust presents a great hazard to the functionality of the slide control. In order to minimize the risk of dust penetrating the housing of the slide control as much as possible and to simultaneously translate the movements of the control knob onto the sliding contact, the housing of the slide control can comprise a slit through which a coupling element, which connects the control knob to the sliding contact, is passed. This coupling element, too, should preferably be made of an electrically conductive material in order to be able to transmit the electric signals from the control knob into the interior of the housing of the slide control, where a corresponding evaluating sensor system can be connected.

In which manner the electric contact between the control knob, made of an electrically conductive material, on the one hand and the coupling element, made of an electrically conductive material, on the other hand is produced, is generally arbitrary. This can be realized particularly easily by the control knob comprising an indentation, by means of which the control knob can be plugged onto the coupling element thus forming an electric contact.

In order to preclude the risk of dust and impurities getting into the interior of the housing of the slide control as much as possible, it is particularly advantageous that the opening formed in the housing of the slide control by the slit is oriented horizontally to the side of the lighting control console or vertically to the bottom of the lighting control console. By this horizontal or downward orientation of the opening in the housing of the slide control, it is prevented that dust and impurities penetrate the housing of the slide control via the opening due to the effects of gravity.

In order to be able to also remotely control the slide control as an alternative to manual operation, it is particularly advantageous if an electric drive motor is provided at the slide control, the slide control being able to be motor-driven by means of said drive motor. In this manner, settings of the slide control can also be started by remote control.

With regard to the slide control being electrically contacted to the other electronic components of the lighting control console, it is particularly advantageous if the slide control comprises a plug contact having several contact elements. A plug complementary in function can then be plugged onto this plug contact in order to electrically connect the entire slide control in the lighting control console in a single assembly movement in this manner.

With regard to the electrical functionality, it is particularly advantageous if the plug contact is fastened on an electronic circuit board of the slide control.

Insofar as the slide control comprises an electronic circuit board having a plug contact, the drive motor of the slide control should preferably be electrically contacted via the electronic circuit board.

An embodiment of the invention is schematically illustrated in the drawings and is further described in an exemplary manner in the following.

DETAILED DESCRIPTION

Figure 1:
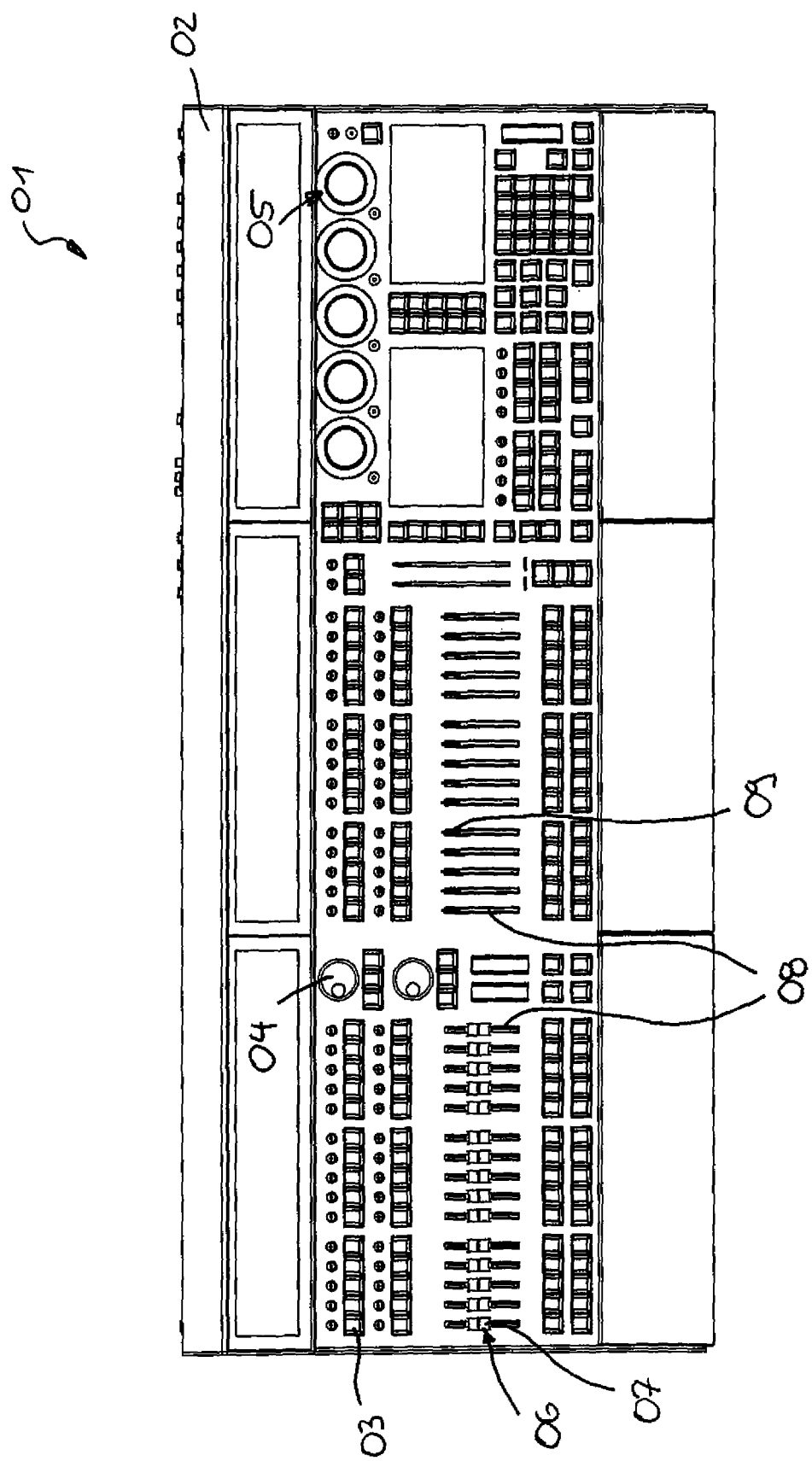
FIG. 1 illustrates a lighting control console for controlling a lighting system having several slide controls in a top view.

FIG. 1 illustrates a lighting control console 01 for controlling a lighting system, which is not further illustrated, in a top view. In order for the user to input operating commands when programming lighting programs, a plurality of mechanical operating elements, such as buttons 03, rotary controls 04, duel encoders 05 and slide controls 06, are installed in the console housing 02. In the illustration according to FIG. 1, only the parts of the slide controls 06 protruding from the upper side of the console housing 02, i.e. the control knobs 07 or the coupling elements 09 protruding through slits 08 when the control knobs 07 are disassembled, can be seen.

Figure 2:
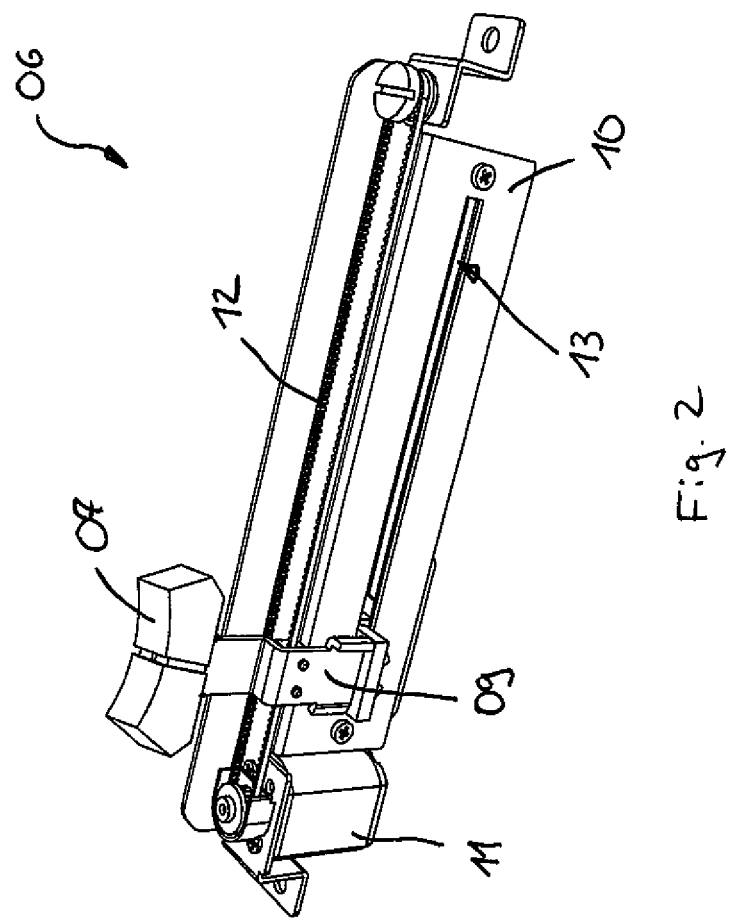
FIG. 2 illustrates one of the slide controls of the lighting control console according to FIG. 1 in a disassembled state in a perspective side view.

FIG. 2 illustrates a slide control 06 having the control knob 07 plugged onto the coupling element 09 in a perspective view. The control knob 07 and the coupling element 09 are each made of an electrically conductive material. Thus, the control knob 07 consists of an electrically conductive plastic and the coupling element 09 consists of metal. In this way, electric signals can be transmitted via the control knob 07 and the coupling element 09. As soon as a user touches the control knob 07 using his fingers, the electrical properties change, these changes being able to be evaluated via corresponding signals received from a tactile sensor system integrated into the housing 10 of the slide control 06.

The slide control 06 is equipped with a drive motor 11 which can drive the coupling element 09 via a drive belt 12. In this manner, the slide control 06 can be displaced not only manually but can also be displaced via remote control of the drive motor 11.

Figure 3:
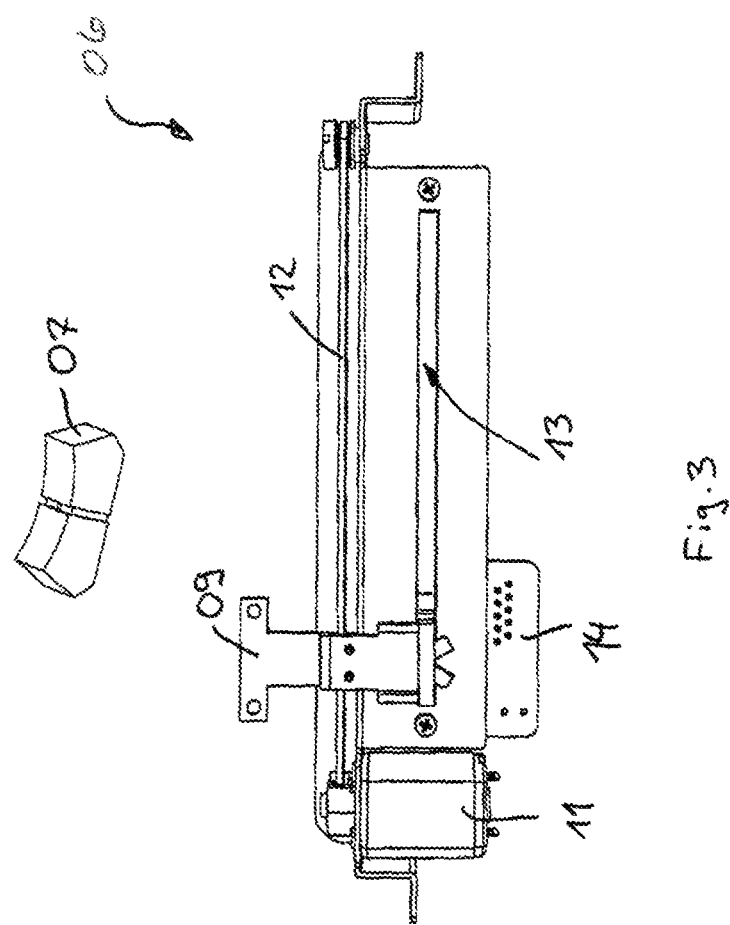
FIG. 3 illustrates the slide control according to FIG. 2 after disassembly of the control knob in a side view.

FIG. 3 illustrates the slide control 06 in a side view when the control knob 07 has been removed. The housing 10 of the slide control 06 comprises a slit 13 through which the coupling element 09 is passed from the exterior in order to be able to connect the sliding element arranged in the interior of the housing 10 and the tactile sensor system arranged in the interior of the housing 10 to the part of the coupling element 09 extending outside of the housing 10 and in particular to the control knob 07 as well. The electronic components of the slide control 06 are installed on an electronic circuit board 14.

Figure 4:
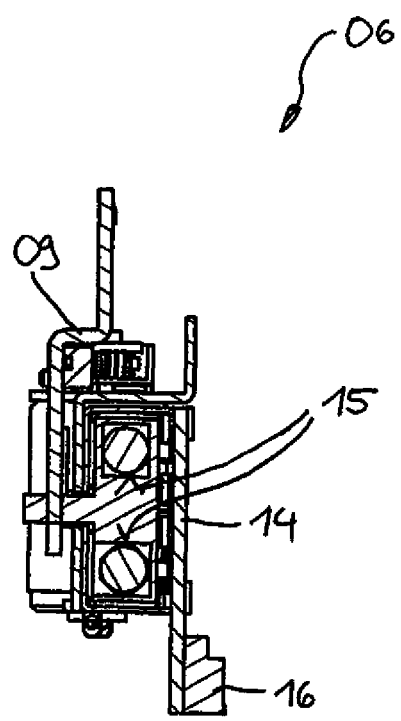
FIG. 4 illustrates the slide control according to FIG. 2 in a cross-sectional view.

FIG. 4 illustrates the slide control 06 in a cross-sectional view. The coupling element 09 and the sliding contact 15 installed in the interior of the housing 10 can be seen, the tactile sensor system also being contacted via the sliding contact 15. The sliding contact 15 in turn is contacted via the electronic circuit board 14 and can be connected to the electronics of the lighting control console 01 by means of a plug contact 16 by plugging a plug thereon.

The invention claimed is:

1. A lighting control console for controlling a lighting system, includes digital adjusting commands being generated in the lighting control console, said adjusting commands being transmitted to the lighting devices of the lighting system via data links, said lighting control console comprising at least one digital processor and at least one digital memory for generating, managing and storing the adjusting commands, and said digital processor and said digital memory being arranged in a console housing, and said lighting control console comprising at least one slide control at which operating commands are being input by the user via linear displacement of a control knob protruding from the upper side of the console housing, and said upper side of the console housing comprising a slit for each slide control, said control knob being connected to said slide control via said slit,
wherein
a tactile sensor system is provided at the slide control for detecting when the user touches the control knob.

2. The lighting control console according to claim 1, wherein
the control knob is made of an electrically conductive material.

3. The lighting control console according to claim 1, wherein
the capacitive change caused by the user touching the control knob can be is detected using the tactile sensor system.

4. The lighting control console according to claim 2, wherein
the control knob is made of an electrically conductive plastic.

5. The lighting control console according to claim 1, wherein
at least one sliding contact is provided in the housing of the slide control, said housing of the slide control comprising a slit through which a coupling element is passed and which connects the control knob to the sliding contact, said coupling element being made of an electrically conductive material and electrically contacting the control knob to the slide control.

6. The lighting control console according to claim 1, wherein
the control knob comprises an indentation configured to be plugged onto the coupling element thus forming an electric contact.

7. The lighting control console according to claim 1, wherein
the opening formed in the housing of the slide control by the slit is oriented horizontally to the side of the lighting control console or vertically to the bottom of the lighting control console.

8. The lighting control console according to claim 1, wherein
an electric drive motor provided at the slide control is configured to drive the slide control.

9. The lighting control console according to claim 1, wherein
the slide control comprises a plug contact having several contact elements, a complementary plug configured to be plugged onto said plug contact for electrically contacting the slide control to the lighting control console.

10. The lighting control console according to claim 9, wherein
the plug contact is fastened on an electronic circuit board of the slide control.

11. The lighting control console according to claim 10, wherein
the drive motor is connected to the electronic circuit board of the slide control for producing an electric contact.

* * * * *

UNITED STATES PATENT AND TRADEMARK OFFICE
CERTIFICATE OF CORRECTION

PATENT NO. : 10,149,372 B2
APPLICATION NO. : 15/869969
DATED : December 4, 2018
INVENTOR(S) : Michael Adenau Page 1 of 1

It is certified that error appears in the above-identified patent and that said Letters Patent is hereby corrected as shown below:

In the Claims

Column 4, Claim 3, Line 48, "knob can be is detected" should be --knob is detected--.

Signed and Sealed this
Fifth Day of February, 2019

Andrei Iancu
*Director of the United States Patent and Trademark Office*